United States Patent
Ho

(10) Patent No.: US 11,908,705 B2
(45) Date of Patent: Feb. 20, 2024

(54) INTERCONNECT SINGULATION

(71) Applicant: TEXAS INSTRUMENTS INCORPORATED, Dallas, TX (US)

(72) Inventor: Chih-Chien Ho, New Taipei (TW)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/504,148

(22) Filed: Oct. 18, 2021

(65) Prior Publication Data

US 2023/0121743 A1 Apr. 20, 2023

(51) Int. Cl.
*H01L 21/48* (2006.01)
*H01L 21/66* (2006.01)

(52) U.S. Cl.
CPC .......... *H01L 21/4842* (2013.01); *H01L 22/20* (2013.01)

(58) Field of Classification Search
CPC .......................... H01L 21/4842; H01L 22/20
See application file for complete search history.

(56) References Cited

U.S. PATENT DOCUMENTS

| | | | |
|---|---|---|---|
| 4,137,546 A | | 1/1979 | Frusco |
| 4,763,409 A * | | 8/1988 | Takekawa ............... H01L 24/50 |
| | | | 29/827 |
| 5,008,615 A * | | 4/1991 | Littlebury ................ G01R 1/06 |
| | | | 324/754.16 |
| 5,208,481 A * | | 5/1993 | Kurita ................. H01L 21/4842 |
| | | | 257/E23.044 |
| 5,723,899 A | | 3/1998 | Shin |
| 8,558,358 B2 * | | 10/2013 | Yamabe .............. H01L 21/4842 |
| | | | 257/676 |
| 2007/0281397 A1 | | 12/2007 | Lo |
| 2012/0223423 A1 | | 9/2012 | Hsu et al. |
| 2016/0190095 A1 * | | 6/2016 | Celaya ............. H01L 23/49548 |
| | | | 438/111 |
| 2023/0121743 A1 * | | 4/2023 | Ho .......................... H01L 22/20 |
| | | | 29/874 |

* cited by examiner

*Primary Examiner* — Minh N Trinh

(74) *Attorney, Agent, or Firm* — Ronald O. Neerings; Frank D. Cimino

(57) ABSTRACT

A method for aligning interconnects that includes trimming and forming a frame of strips of interconnects. The frame of strips of interconnects includes interdigitated pins. The method also includes removing siderails from the frame of strips of interconnects to provide an array of strips of interconnects. The method includes aligning a first set of strips of interconnects in the array of strips of interconnects such that pins of the first set of strips of interconnects are aligned with pins of a second set of strips of interconnects in the array of strips of interconnects. A strip of interconnects of the first set of strips of interconnects are adjacent to a strip of interconnects of the second set of strips of interconnects to provide an aligned array of strips of interconnects. The method further includes singulating the aligned array of strips of interconnects.

20 Claims, 12 Drawing Sheets

INTERCONNECT SINGULATION

TECHNICAL FIELD

This disclosure relates to interconnects for integrated circuit (IC) chips, and more particularly, to singulation of interconnects for IC chips.

BACKGROUND

An interconnect (alternatively referred to as a lead frame) is a metal structure inside an integrated circuit (IC) chip package that carries signals from a die to the outside. The interconnect includes a die pad, where the die is placed, surrounded by leads, metal conductors leading away from the die to the external circuits. The end of each lead closest to the die ends in a bond pad. Small bond wires connect the die to each bond pad. Mechanical connections fix all these parts into a rigid structure, which makes the whole interconnect easy to handle automatically.

The die is glued or soldered to the die pad inside the interconnect, and then bond wires are attached between the die and the bond pads to connect the die to the leads. In a process called encapsulation, a plastic case is molded around the lead frame and die, exposing only the leads. The leads are cut off outside the plastic body and any exposed supporting structures are cut away. The external leads are then bent (formed) to the desired shape. In various examples, interconnects are employed to manufacture a quad flat no-leads package (QFN), a quad flat package (QFP), or a dual in-line package (DIP).

SUMMARY

A first example relates to a method for aligning interconnects that includes trimming and forming a frame of strips of interconnects. The frame of strips of interconnects includes interdigitated pins. The method also includes removing siderails from the frame of strips of interconnects to provide an array of strips of interconnects. The method includes aligning a first set of strips of interconnects in the array of strips of interconnects such that pins of the first set of strips of interconnects are aligned with pins of a second set of strips of interconnects in the array of strips of interconnects. A strip of interconnects of the first set of strips of interconnects are adjacent to a strip of interconnects of the second set of strips of interconnects to provide an aligned array of strips of interconnects. The method further includes singulating the aligned array of strips of interconnects to provide interconnects for dies of integrated circuit (IC) chips.

A second example relates to an array of strips of interconnects that includes a first set of strips of interconnects in the array of strips of interconnects and a second set of strips of interconnects in the array of strips of interconnects. Strips of interconnects of the first set of strips of interconnects have a first distance between an edge of a respective strip of interconnects of the first strip of interconnects and a pin closest to the edge of the respective strip of interconnects of the first strip of interconnects, and strips of interconnects of the second set of strip of interconnects are adjacent to strips of interconnects of the first set of strips of interconnects. The strips of interconnects of the second set of strips of interconnects have a second distance between an edge of a respective strip of interconnects of the second set of strips of interconnects and a pin closest to the edge of the respective strip of interconnects of the second set of strips of interconnects, the first distance being different than the second distance. Moreover, pins of the first set of strips of interconnects in the array of strips of interconnects are interleaved with the pins of the second set of strips of interconnects in the array of strips of interconnects.

DETAILED DESCRIPTION

Figure 1:
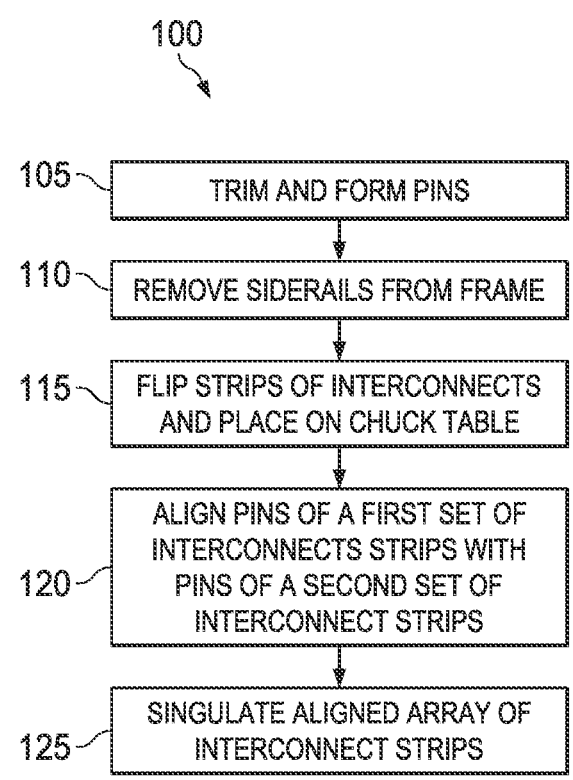
FIG. 1 illustrates a flowchart of an example method for singulating interconnects from a frame of a strips of interconnects.

This description relates to a method for singulating interconnects (e.g., lead frames) from a frame of strips of interconnects. The frame includes strips of interconnects that are held together with sidewalls, namely a first side wall and a second sidewall that are formed of plastic. The strips of interconnects within the frame are coupled with interdigitated pins. In some examples, the strips of interconnects are high density (HyDE) strips of interconnects.

The pins of the strips of interconnects are trimmed and formed. Trimming and forming the pins includes removing material (e.g., plastic and/or metal) holding the interdigitated pins together, and bending (forming) the pins to a desired shape. The siderails are cut from the frame of strips of interconnects to provide an array of strips of interconnects. The cutting of the siderails includes making two (2) parallel crosscuts across the strips of interconnects to release the strips of interconnects from the sidewall. The array of strips of interconnects include a first set of strips of interconnects that have pins offset from pins of a second set of strips of interconnects. Members of the first set of strips of interconnects are adjacent to members of the second set of strips of interconnects to provide an array of strips of interconnects. Due to the initial state of the pins being interdigitated in the frame of the strips of interconnects, trimming and forming the pins still leaves the pins offset from each other.

Accordingly, the first set of strips of interconnects are moved to align the pins of the first strips of interconnects with the pins of the second set of strips of interconnects to provide an array of aligned strips of interconnects. To align the pins of the strips of interconnects of the first set with the pins of strips of the interconnects of the second set, the strips of interconnects of the first set are moved from a sawing chuck table to a position where an image of a respective strip of interconnects is captured to identify an offset between the pins of the respective strip of interconnects of the first set and the pins of the strips of interconnects of the second set. The respective strip of interconnects is moved by the offset, and returned to the sawing chuck table. By moving each strip of interconnects in the first set in this manner, the aligned array of strips of interconnects is provided.

The aligned array of strips of interconnects are singulated to provide interconnects for dies of integrated circuit (IC) chips. Singulation of the aligned array of strips of interconnects includes making multiple parallel crosscuts across the strips of interconnects, both the first set and the second set. By employing the method described, the need for mechanical features in the side rails (U-bars and/or S-bars) is obviated. Instead, an image of each strip of interconnects in the first set of interconnects is capture and the offset is measured, and this offset is employed to move strips of interconnects to align the pins.

FIG. 1 illustrates a flowchart of an example method 100 for singulating interconnects (e.g., lead frames) from a frame of strips of interconnects. In some examples, the strips of interconnects are high density (HyDE) strips of interconnects. The strips of interconnects within the frame are held together with sidewalls. The strips of interconnects are coupled with interdigitated pins. At 105, pins on the strips of interconnects are trimmed and formed. Trimming and forming the pins includes removing material (e.g., plastic and/or metal) holding the interdigitated pins together, and bending (forming) the pins. At 110, the siderails are removed from the frame of strips of interconnects to provide an array of strips of interconnects by cutting. The cutting of the siderails includes making two (2) crosscuts across the strips of interconnects of the first set and the strips of the interconnects of the second set, and these crosscuts are made near edges of each of the strips of interconnects.

The array of strips of interconnects include a first set of strips of interconnects that have pins offset from pins of a second set of strips of interconnects. Members of the first set of strips of interconnects are adjacent to members of the second set of strips of interconnects to provide an aligned array of strips of interconnects. Due to the initial state of the pins being interdigitated in the frame of the strips of interconnects, trimming and forming the pins still leaves the pins offset from each other. In particular, in one example, a first pin of the first set of strips of interconnects are closer to an edge cut (at 105) to separate the siderails from the strips of strips of interconnects than a first pin on the second set of strips of interconnects. Stated differently, there is a first distance between the edge and a first pin of the first set of strips of interconnects and a second distance between the edge and a first pin of the second strips of interconnects, the first distance and the second distance being different distances.

At 115, the strips of interconnects (both the first set and the second set) are flipped and placed on a sawing chuck table. At 120, the pins of first set of strips of interconnects in the array of strips of interconnects are aligned (moved) such that pins of the first set of strips of interconnects are aligned with pins of a second set of strips of interconnects in the array of strips of interconnects. To align the first set of strips of interconnects, a pick-and-place (PnP) head raises each strip of interconnects from the sawing chuck table in the first set and moves them to a position where an image of each respective strip of interconnects in the first set is captured. The captured image is examined to measure an offset between pins on the first set of strips of interconnects and the strip of interconnects of the second set. Responsive to determining the offset, the strips of interconnects in the first set are moved by the offset and returned to the sawing chuck table to form an aligned array of strips of interconnects.

At 125, the aligned array of strips of interconnects are singulated to provide interconnects for dies of integrated circuit (IC) chips. Singulation of the aligned array of strips of interconnects includes making multiple parallel crosscuts across the strips of interconnects, both the first set and the second set. By employing the method 100, the need for mechanical features in the side rails (U-bars and/or S-bars) is obviated. Instead, an image of each strip of interconnects in the first set of interconnects is captured and offset is measured and this offset is employed to move strips of interconnects to align the pins.

FIGS. 2-14 illustrate stages of a method of singulating interconnects (e.g., lead frames) from a frame of strips of interconnects. For purposes of simplification of explanation, FIGS. 2-14 employ the same reference numbers to denote the same structure.

Figure 2:
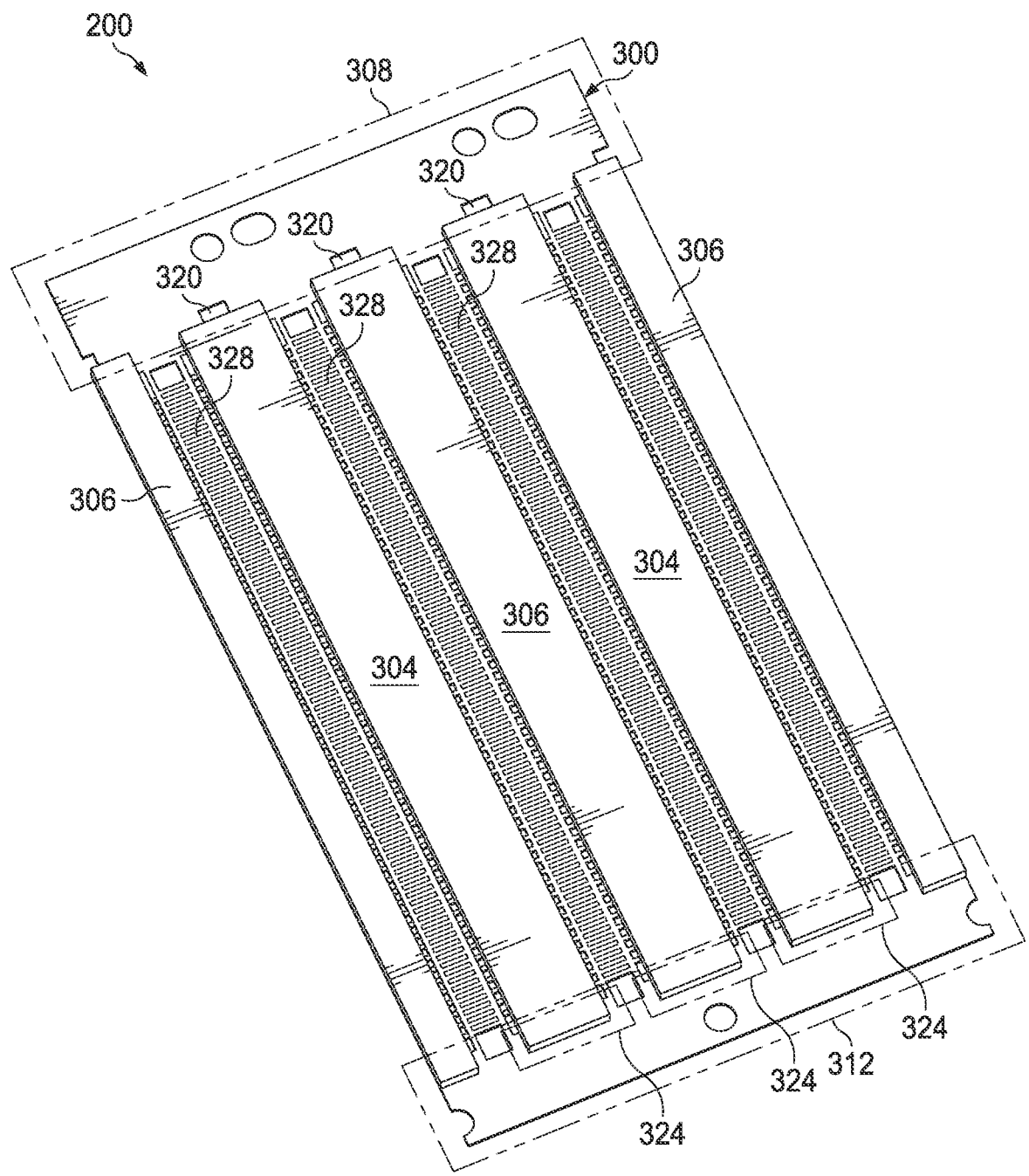
FIG. 2 illustrates a first stage of an example method for singulating interconnects from a frame of strips of interconnects.
Figure 3:
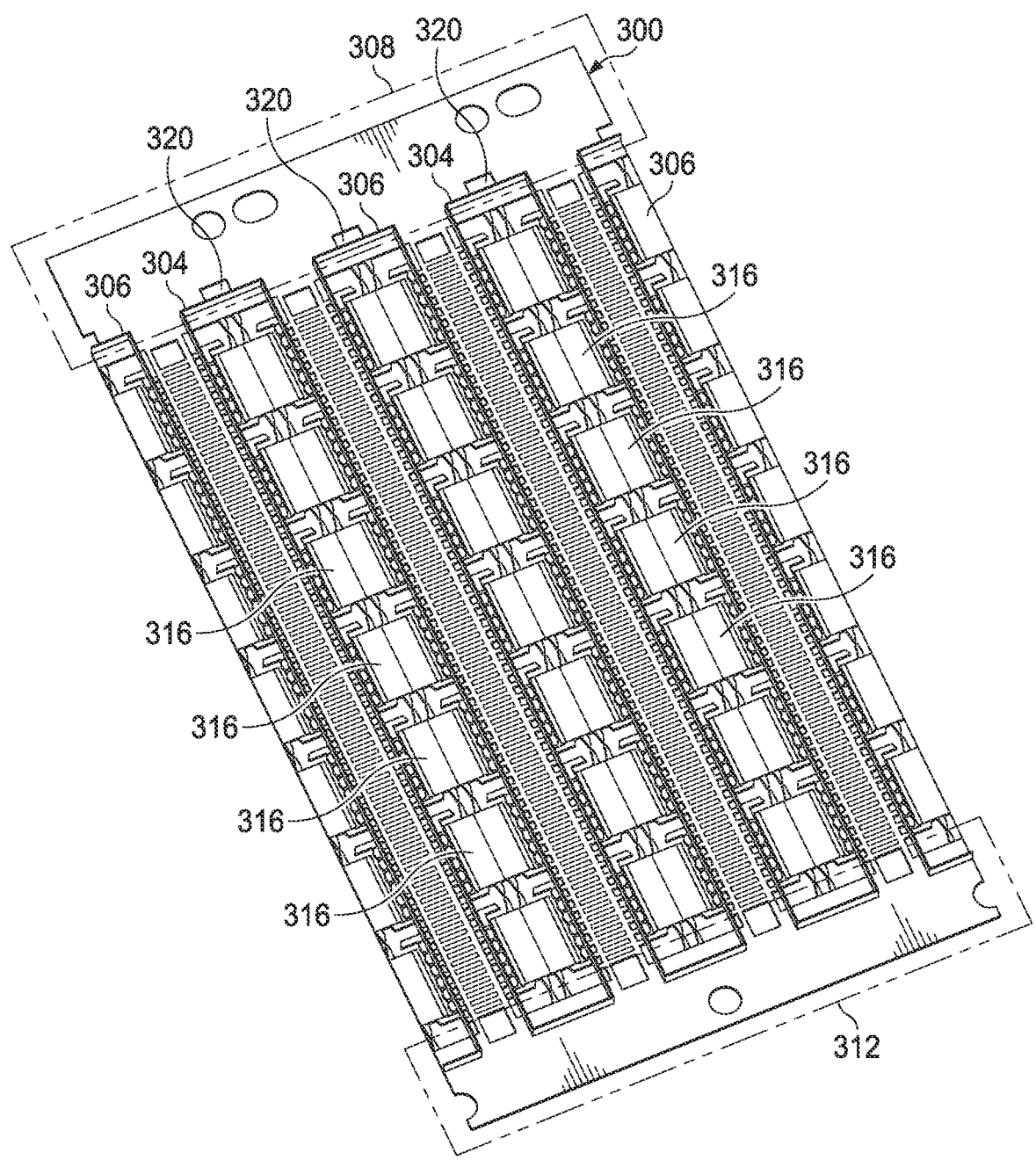
FIG. 3 illustrates the first stage of the example method for singulating interconnects from a frame of strips of interconnects, wherein strips of interconnects are made transparent.

At 200, in a first stage, as illustrated in FIG. 2, a frame 300 of strips of strips of interconnects is provided. The strips of interconnects includes strips of interconnects 304 of a first set and strips of interconnects 306 of a second set. The strips of interconnects 304 of the first set and the strips of interconnects 306 of the second set are offset from each other. Moreover, the strips of interconnects of the frame 300 (including the strips of interconnects 304 of the first set and the strips of interconnects 306 of the second set) are high density (HyDe) strips of interconnects. The frame 300 includes a first siderail 308 and a second side rail 312 that are attached to opposing edges of interconnects 304 of the first set and interconnects 306 of the second set. The interconnects 304 of the first set and the interconnects 306 of the second set are formed of bars of plastic (or other molding material) that circumscribe individual interconnects for dies to form integrated IC chips. FIG. 3 illustrates the frame 300 wherein the interconnects 304 of the first set and interconnects 306 of the second set are transparent to reveal the individual interconnects with die pads 316, only some of which are labeled.

Referring back to FIG. 2, the first siderail 308 includes a gap 320 for each strip of interconnects in the interconnects 304 of the first set and the interconnects 306 of the second set. The gaps 320 have a rectangular shape. Moreover, the gaps 320 have the same shape. Similarly, the second side rail 312 includes an extended region 324 for each strip of interconnects in the interconnects 304 of the first set an the interconnects 306 of the second set. Each of the extended regions 324 have the same shape. In combination, the gaps 320 and the extended regions 324 are referred to as seats for the strips of interconnects. In the example illustrated, the seat (a combination of a gap 320 and an extended region 324) of each strip of interconnect has the same shape.

The interconnects 304 of the first set and the interconnects 306 of the second set have interdigitated pins 328. Stated differently, pins from members in the first set of strips of interconnects 304 are interleaved and interlocked with pins from members of the strips of interconnects 306 of the second set. Moreover, in the first stage 200, the pins from adjacent strips of interconnects are mechanically coupled. That is, an interconnect 304 of the first set that is adjacent to an interconnect 306 of the second set are mechanically coupled through the interdigitated pins 328.

Figure 4:
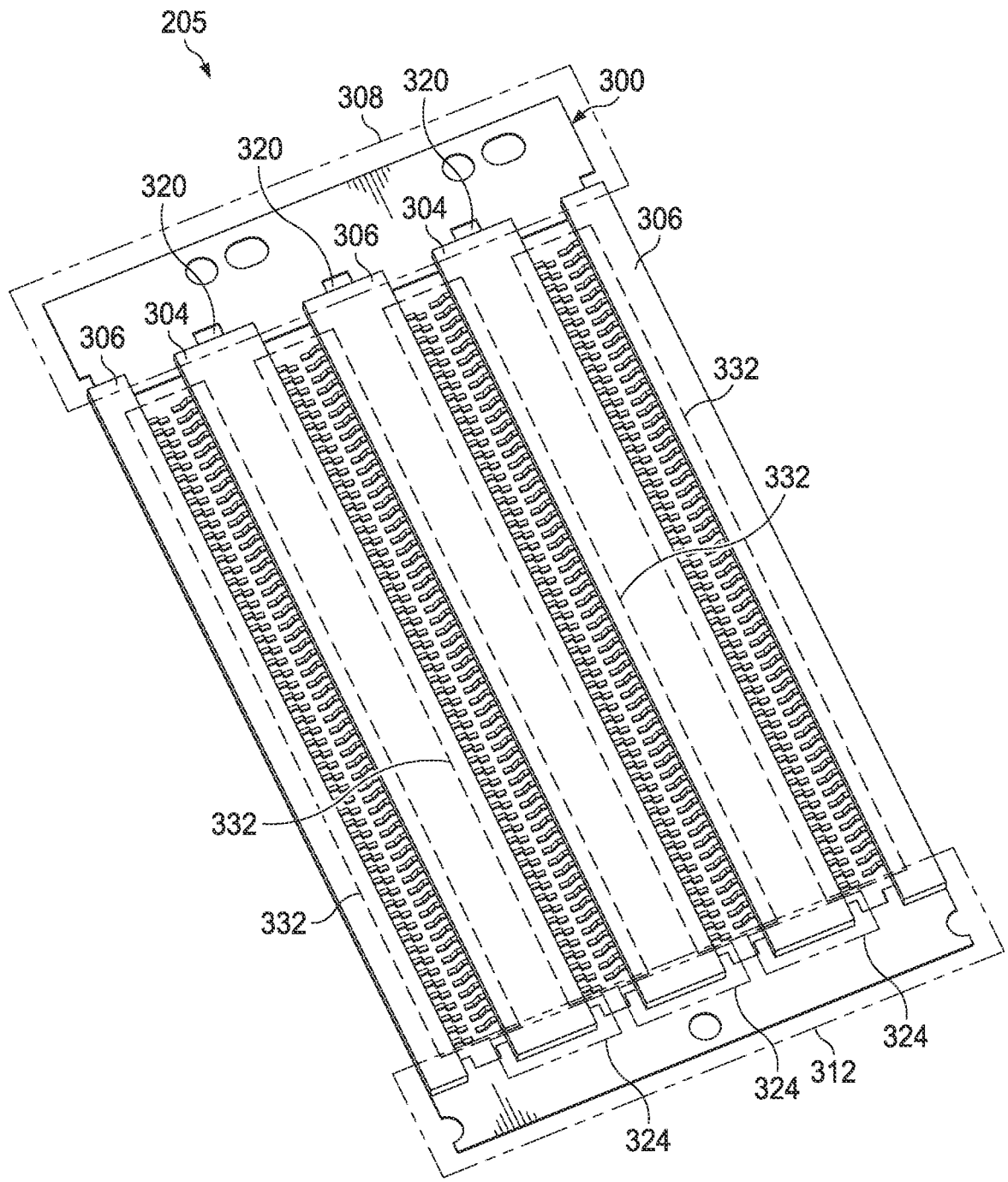
FIG. 4 illustrates a second stage of the example method for singulating interconnects from a frame of strips of interconnects, wherein pins are trimmed and formed.

In a second stage of the method, at 205, as illustrated in FIG. 4, pins of the strips of the interconnects 304 of the first set and the strips of interconnects 306 of the second set are trimmed and formed to provide trimmed and formed pins 332 extending from each side of each strip of the strip of interconnects 304 of the first set and the interconnects 306 of the second set. Trimming of the pins 332 removes material mechanically coupling the interdigitated pins 328. Forming the pins 332 refers to bending the pins 332. The pins 332 are formed (bent) to resemble an 'S' from a sideview.

Figure 5:
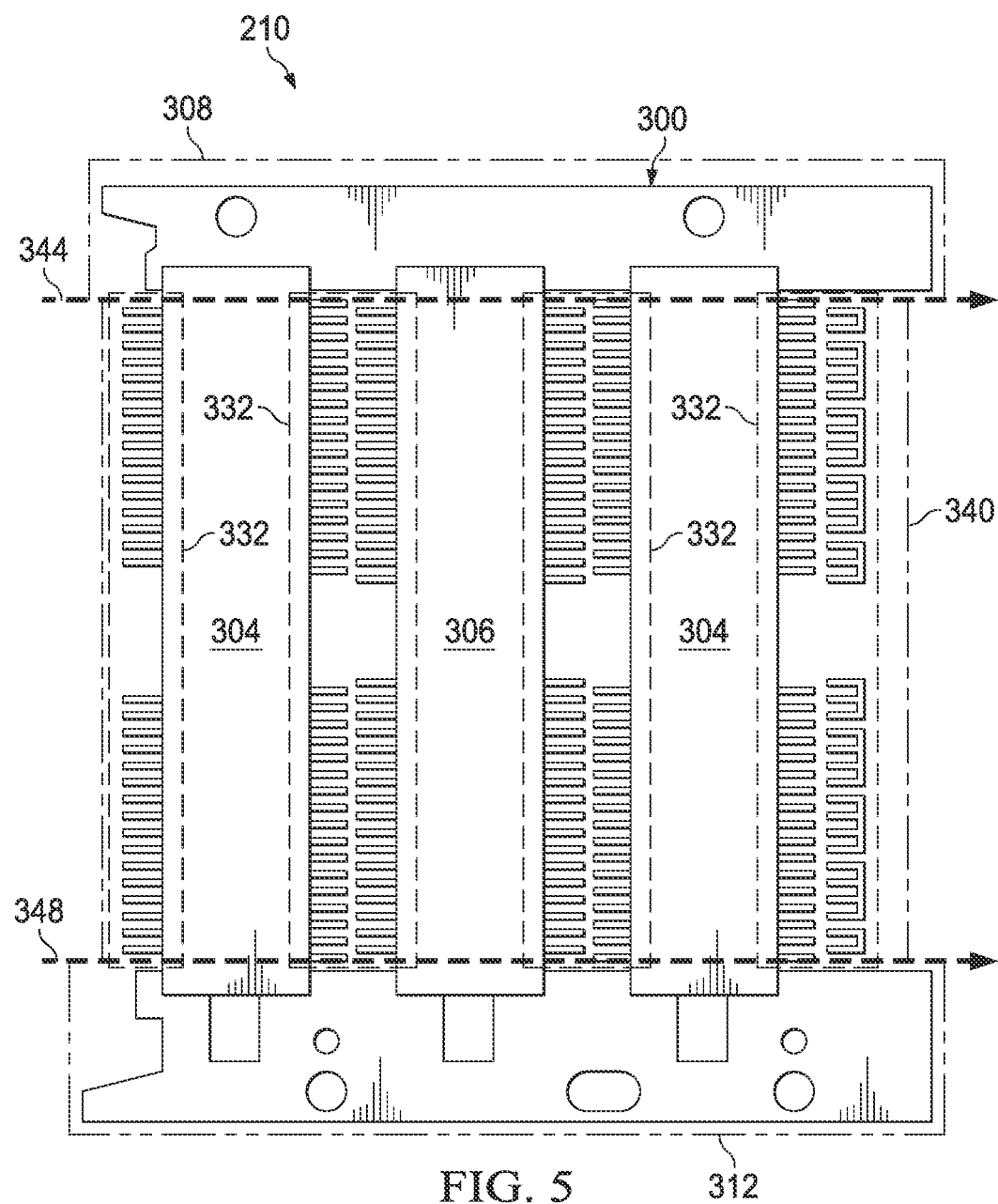
FIG. 5 illustrates a third stage of the example method for singulating interconnects from a frame of strips of interconnects, wherein siderails are removed by cutting.
Figure 6:
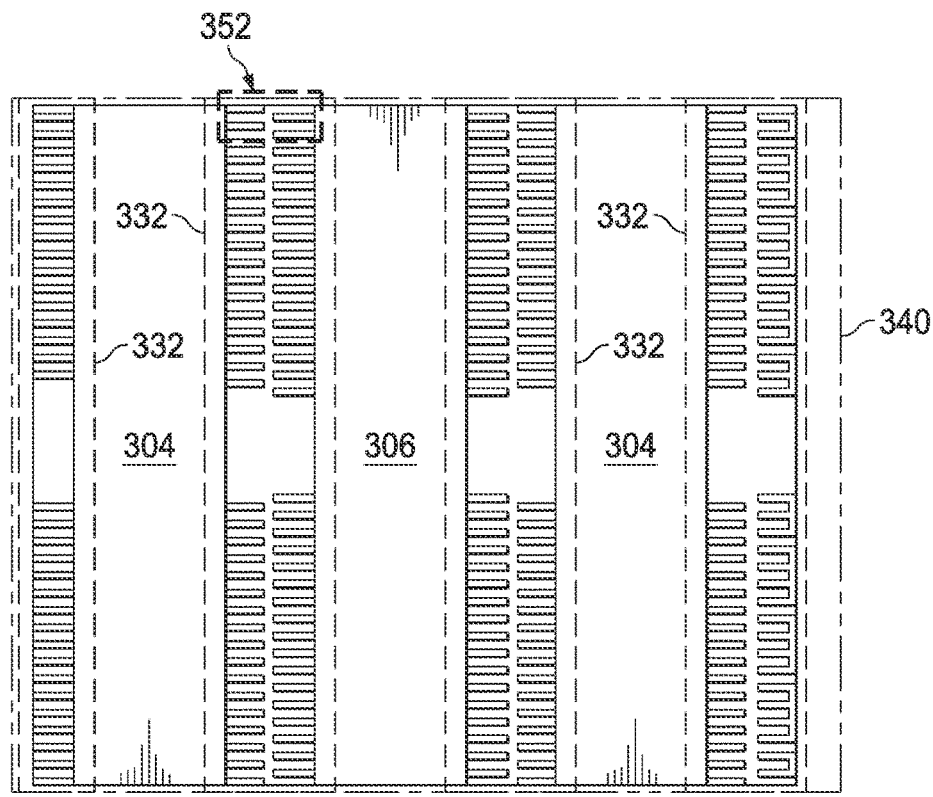
FIG. 6 illustrates the third stage of the example method for singulating interconnects from a frame of strips of interconnects, wherein the siderails have been removed.
Figure 7:
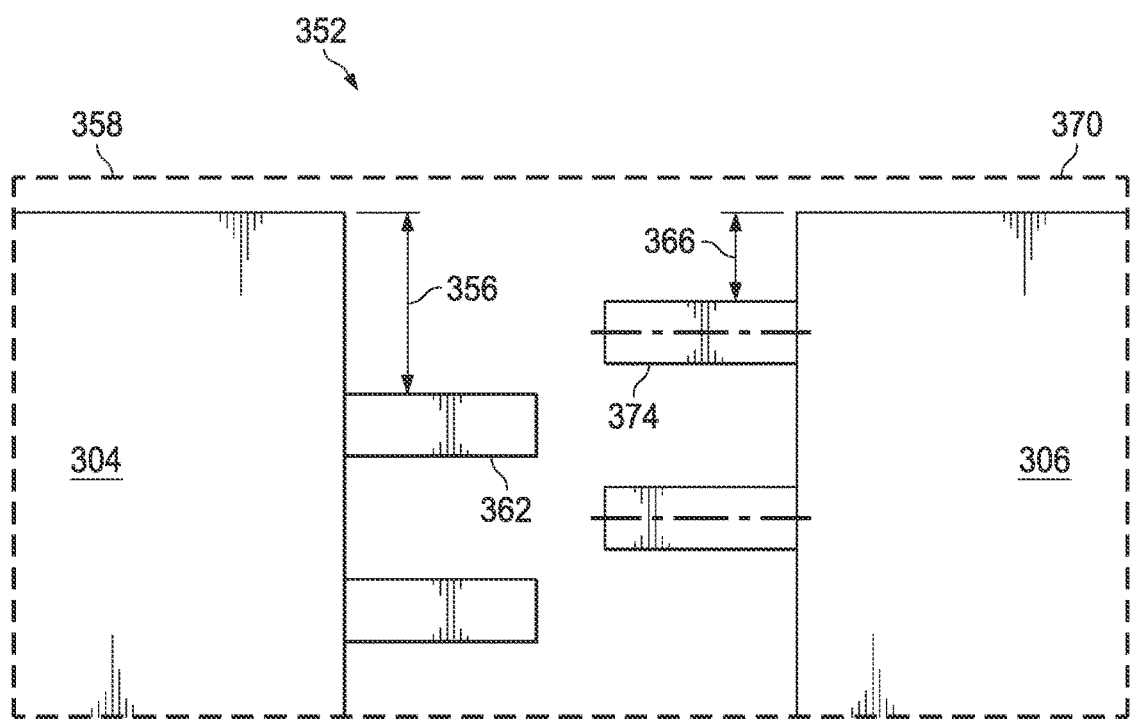
FIG. 7 illustrates an expanded view of adjacent strips of interconnects.

In a third stage of the method, as illustrated in FIG. 5 at 210, the first siderail 308 and the second side rail 312 of the frame 300 of strips of interconnects are removed from the frame 300 to provide an array of strips of interconnects 340. Removing the first siderail 308 includes making a first cut along a first cutline 344 across first edges of the strips of interconnects 304 of the first set and the strips of interconnects 306 of the second set. Similarly, removing the second side rail 312 includes making a second cut along a second cutline 348 across second edges of the strips of interconnects 304 of the first set and the strips of interconnects 306, the second edges opposing the first edges. FIG. 6 illustrates the array of strips of interconnects 340 that have been separated from the first siderail 308 and the second side rail 312. FIG. 7 illustrates an expanded view of a region 352 labeled in FIG. 6.

As illustrated in FIG. 7, a strip of interconnects 304 of the first set is adjacent to a strip of interconnects 306 of the second set. Moreover, there is a first distance 356 between an edge 358 of the strip of interconnects 304 of the first set and a first pin 362, namely the pin nearest the edge 358. Also, there is a second distance 366 between an edge 370 of the strip of interconnects 306 of the second set and a first pin 374, namely a pin nearest the edge 370. The second distance 366 is less than the first distance 356. That is, the first pin 374 is closer to the edge 370 of the strip of interconnects 306 than the first pin 362 is to the edge 358 of the strip of interconnects 304 of the first set. The edge 358 of the strip of interconnects 304 of the first set and the edge 370 of the strip of interconnects 306 of the second set are formed by the first cut along the first cutline 344 illustrated in FIG. 5.

Figure 8:
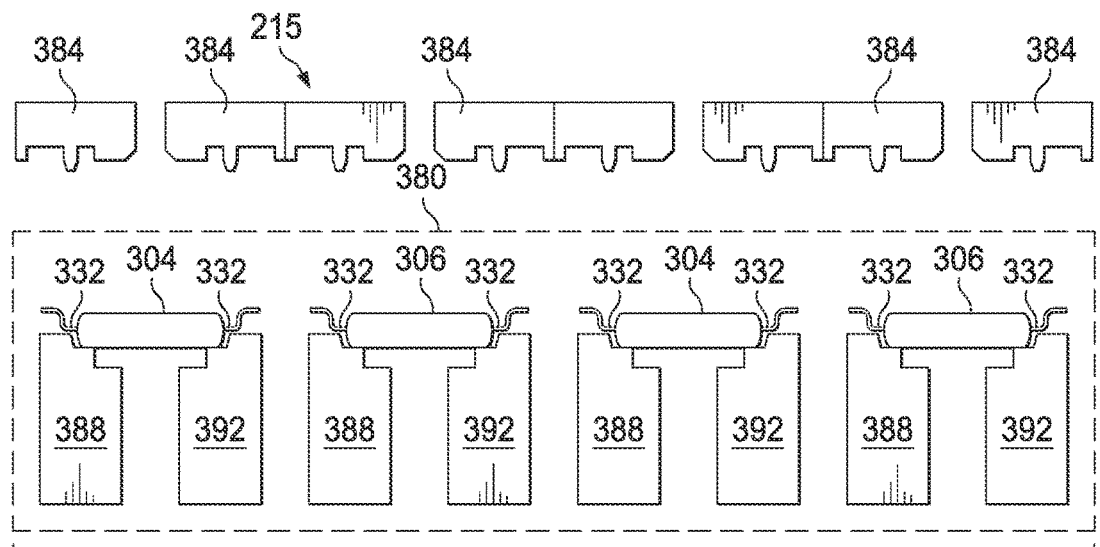
FIG. 8 illustrates a fourth stage of the example method for singulating interconnects from a frame of strips of interconnects, wherein an array of strips of interconnects rest on a sawing chuck table.

In a fourth stage of the method, at 215, as illustrated in FIG. 8, the strips of interconnects 304 of the first set and the strips of interconnects 306 of the second set are flipped and placed on a sawing chuck table 380 that underlies pick and place (PnP) heads 384. The sawing chuck table 380 includes a set of first side pillars 388 and a set of second side pillars 392. The first side pillars 388 and the second side pillars 392 are paired and spaced apart to provide a resting place for a strip of interconnects, namely the strip of interconnects 304 of the first set or the strip of interconnects 306 of the second set. The first side pillars 388 and the second side pillars 392 are shaped to avoid contact with the pins 332 on the strip of interconnects 304 of the first set or the strip of interconnects 306 of the second set.

Figure 9:
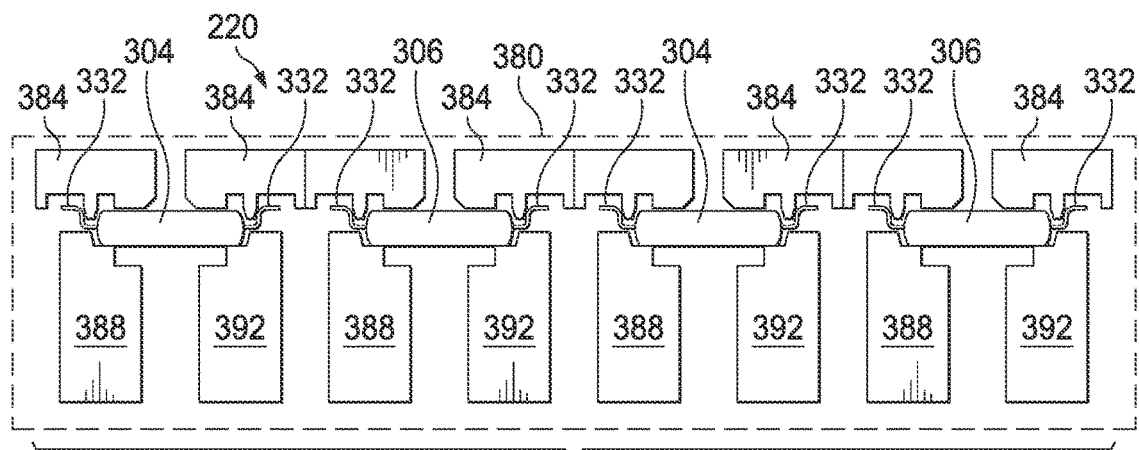
FIG. 9 illustrates a fifth stage of the example method for singulating interconnects from a frame of strips of interconnects, wherein pick and place (PnP) heads engage a set of the strips of interconnects.
Figure 10:
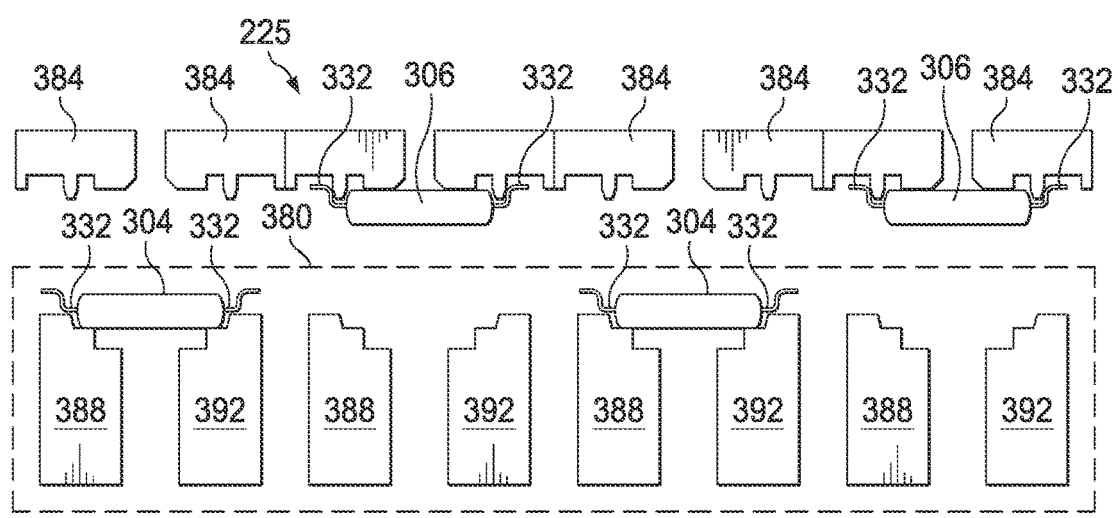
FIG. 10 illustrates a sixth stage of the example method for singulating interconnects from a frame of strips of interconnects, wherein the PnP heads ascend a set of the strips of interconnects.

In a fifth stage of the method at 220, as illustrated in FIG. 9 the PnP heads 384 descend along a vertical axis to engage the strip of interconnects 306 of the second set. Also, the PnP heads 384 do not engage with the strip of interconnects 304 of the first set. Stated differently, the PnP heads 384 engage with every other strip of interconnects.

In a sixth stage of the method at 225 the PnP heads 384 ascend along the vertical axis and ascend the strip of interconnects 306 of the second set away from the sawing chuck table 380. Stated differently, the PnP heads 384 pull every other strip of interconnects up and away from the sawing chuck table 380.

Figure 11:
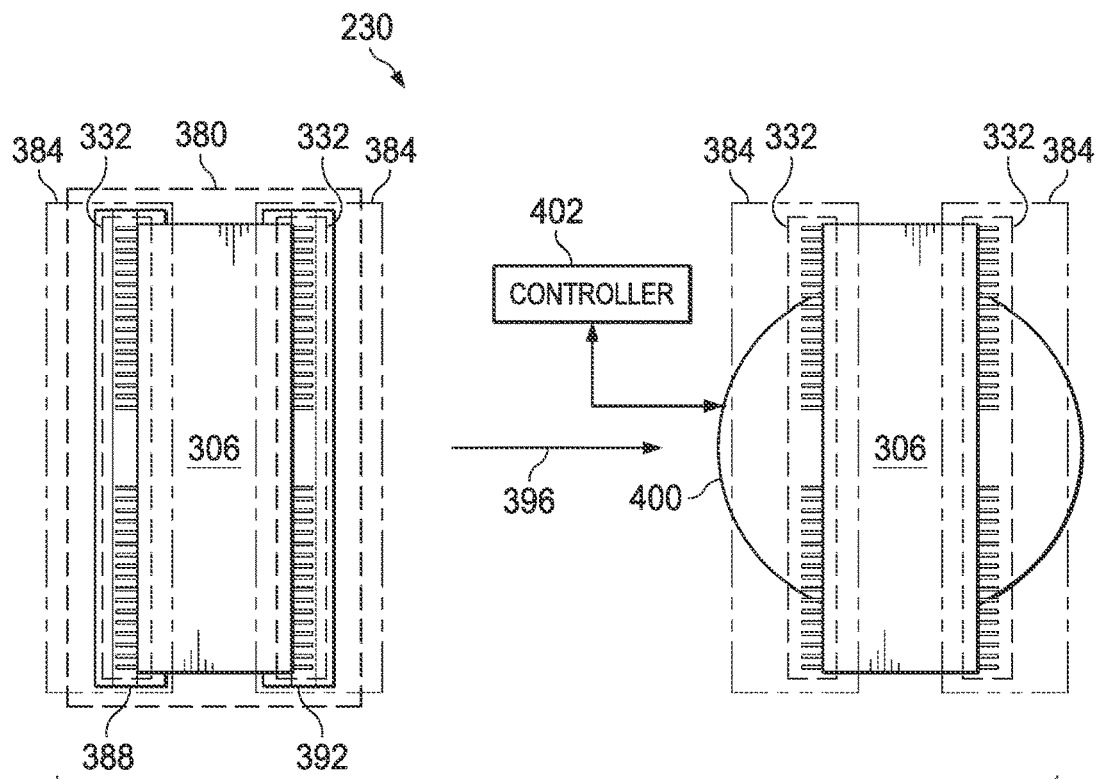
FIG. 11 illustrates a seventh stage of the example method for singulating interconnects from a frame of strips of interconnects, wherein a strip of interconnects is moved to a position over an imager.

In a seventh stage of the method at 230 as illustrated in FIG. 11, the PnP heads 384 move the strips of interconnects 306 of the second set from an initial position along a first horizontal direction, which is perpendicular to the vertical direction. FIG. 11 illustrates a single instance of the strip of interconnects 306 of the second set for purposes of simplification of explanation. Also, the PnP heads 384 are transparent for clarity. More particularly, in FIG. 11, the strip of interconnects 306 of the second set are moved by the PnP heads 384 in the initial position away from the sawing chuck table 380 in a direction indicated by an arrow 396. The strip of interconnects 306 of the second set are moved until the strip of interconnects 306 of the second set overlay an imager 400 (e.g., an optical sensor) that captures an image of the strip of interconnects 306 of the second set. More particularly, the image of the strip of interconnects 306 of the second set captured by the imager 400 reveals a location of the pins 332.

A controller 402 (or other computing platform) compares the image of the strip of interconnects 306 of the second set with a predetermined location of pins 332 of the strip of interconnects 304 of the first set to measure an offset needed for the strip of interconnects 306 of the second set. The offset for the strip of interconnects 306 of the second set defines a distance that the strip of interconnects 306 of the second set need to move to align the pins 332 of the strip of interconnects 306 of the first set with the strip of interconnects 304 of the first set (that are still situated on the sawing chuck table 380). In some examples, the controller 402 is implemented as a computing platform that includes a processing unit (e.g., a processor core) that accesses and executes machine readable instructions and a non-transitory memory that stores the machine readable instructions. In other examples, the controller 402 has embedded machine readable instructions.

Figure 12:
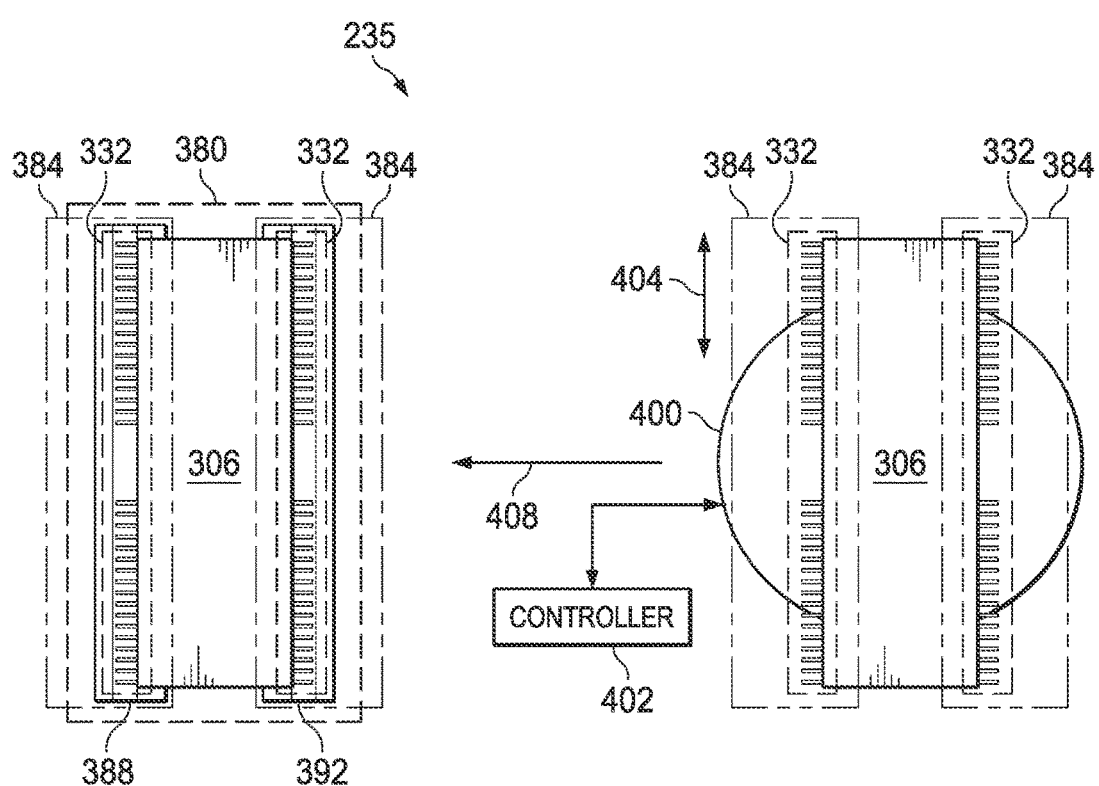
FIG. 12 illustrates an eight stage of the example method for singulating interconnects from a frame of strips of interconnects, wherein a strip of interconnects is moved to align pins on the strip of interconnects.

In an eighth stage of the method at 235, as illustrated in FIG. 12, the PnP heads 384 move the strip of interconnects 306 of the second set by the measured offset in a second horizontal direction perpendicular to the first horizontal direction and perpendicular to the vertical direction. In some examples, the controller 402 controls the movement of the PnP heads 384. More particularly, the PnP heads 384 move the strip of interconnects 306 of these second set by the measured offset in a direction indicated by the arrows 404, which is perpendicular to the arrow 396. In response to moving the strip of interconnects 306 of the second set in the second horizontal direction by the measured offset, the PnP heads 384 move the strip of interconnects 306 of the second set in a direction indicated by the arrow 408 (opposite the direction of the arrow 396) to return the strip of interconnects 306 of the second set to the sawing chuck table 380.

Figure 13:
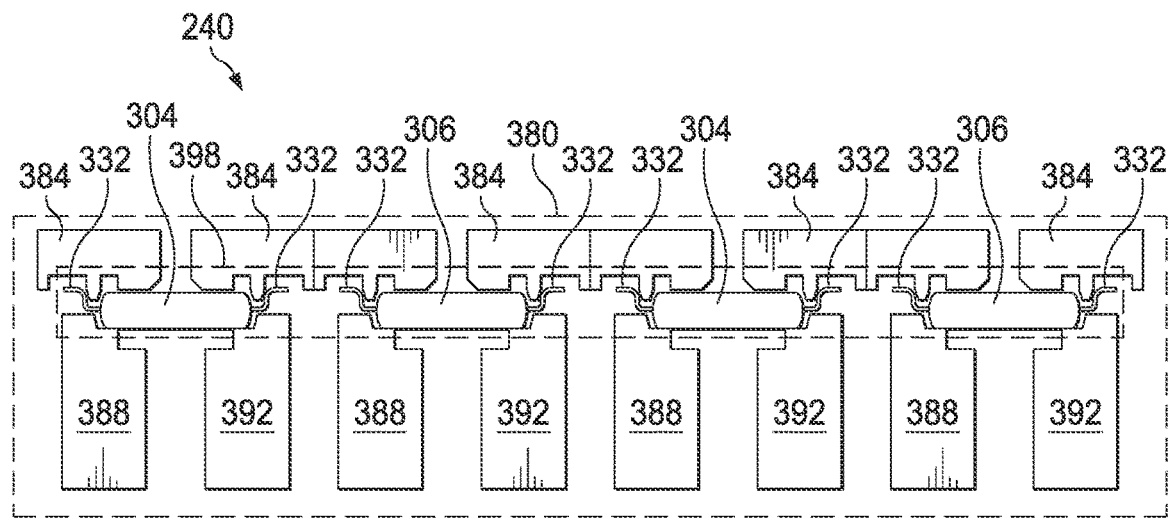
FIG. 13 illustrates a ninth stage of the example method for singulating interconnects from a frame of strips of interconnects, wherein a strip of interconnects is moved to align pins on the strip of interconnects.

In a ninth stage of the method at 240, as illustrated in FIG. 13 the PnP heads 384 descend along a vertical axis to release the strip of interconnects 306 of the second set to the corresponding first side pillars 388 and the second side pillars 392 of the sawing chuck table 380. Stated differently, the PnP heads 384 release every other strip of interconnects onto the sawing chuck table 380. Because the strip of interconnects 306 of the second set have been moved by the determined offset (as described in FIG. 12), the pins 332 of the strips of interconnects 304 of the first set are aligned with the pins 332 of the strips of interconnects 306 of cut the second set, such that an aligned array of strips of interconnects 398 is formed. The aligned array of strips of interconnects are arranged such that the pins 332 of the strip of interconnects 304 of the first set are aligned with strips of interconnects 306 within about 25 micrometers or less. Unless otherwise stated, in this description, 'about' preceding a value means +/−10 percent of the stated value."

Figure 14:
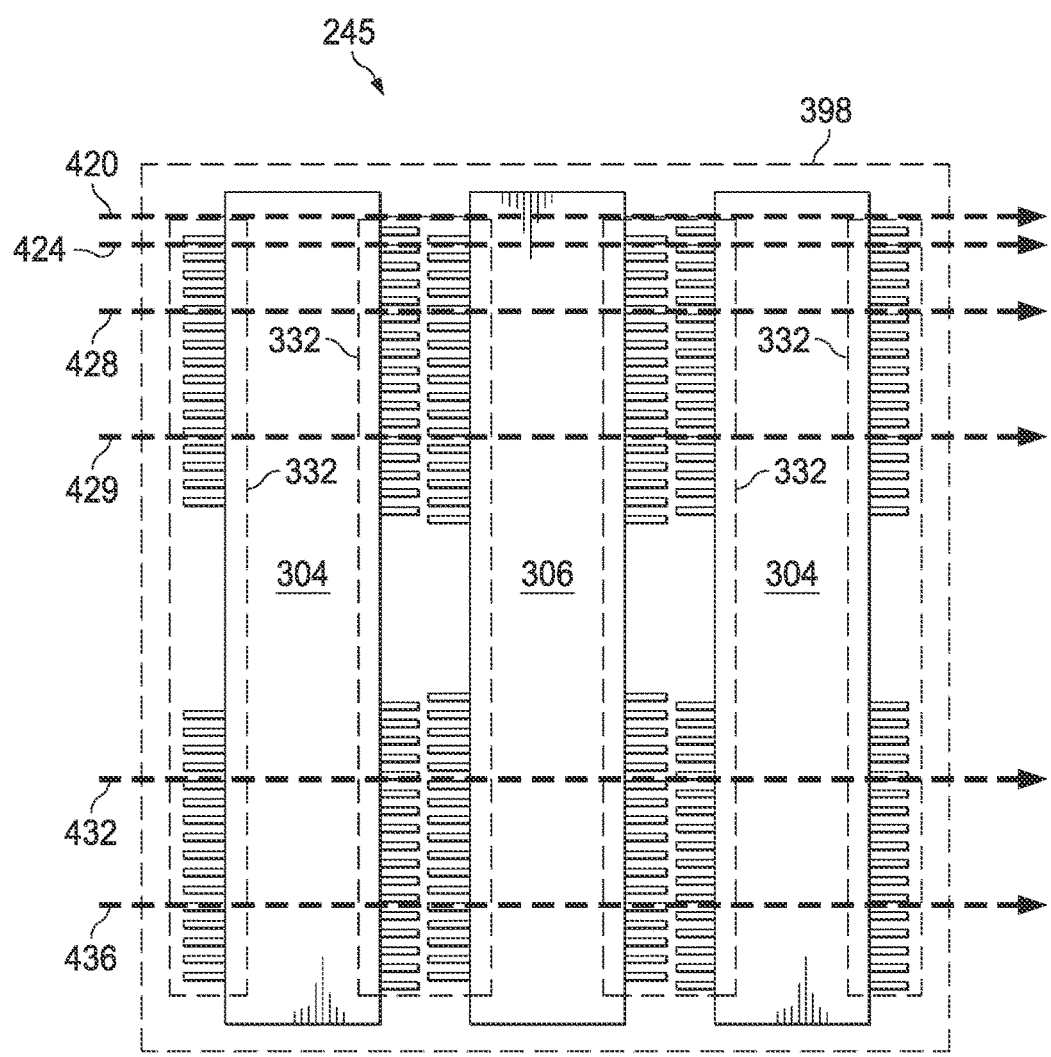
FIG. 14 illustrates a tenth stage of the example method for singulating interconnects from a frame of strips of interconnects, wherein the PnP heads descend set of the strips of interconnects to a sawing chuck table.

In a tenth stage of the method at 245, as illustrated in FIG. 14, responsive to returning the strips of interconnects 306 of the second set to the sawing chuck table 380, the aligned array of strips of interconnects 398 (that includes both the strips of interconnects 304 of the first set and the strips of interconnects 306 of the second set) are singulated into individual interconnects. As illustrated in FIG. 14, the array of interconnects 340 are crosscut (sawn) as indicated by cutlines 420, 424, 428, 429, 432 and 436 to singulate the individual interconnects. As illustrated, by aligning the pins 332 of the strip of interconnects 306 of the second set with the pins 332 of the strip of interconnects 304 of the second set are cut with the same lines, namely, cutlines 420, 424, 428, 429, 432 and 436. Stated differently, by aligning the pins 332 of the array of strips of interconnects 340 to form the aligned array of strips of interconnects 398, straight cuts to singulate the interconnects are possible. Although the example illustrated in FIG. 14 has six (6) cuts characterized by the cutlines 420, 424, 428, 429, 432 and 436, in other examples, there are more cuts or fewer cuts. The resultant singulated interconnects are dual in line package (DIP) interconnects.

Figure 15:
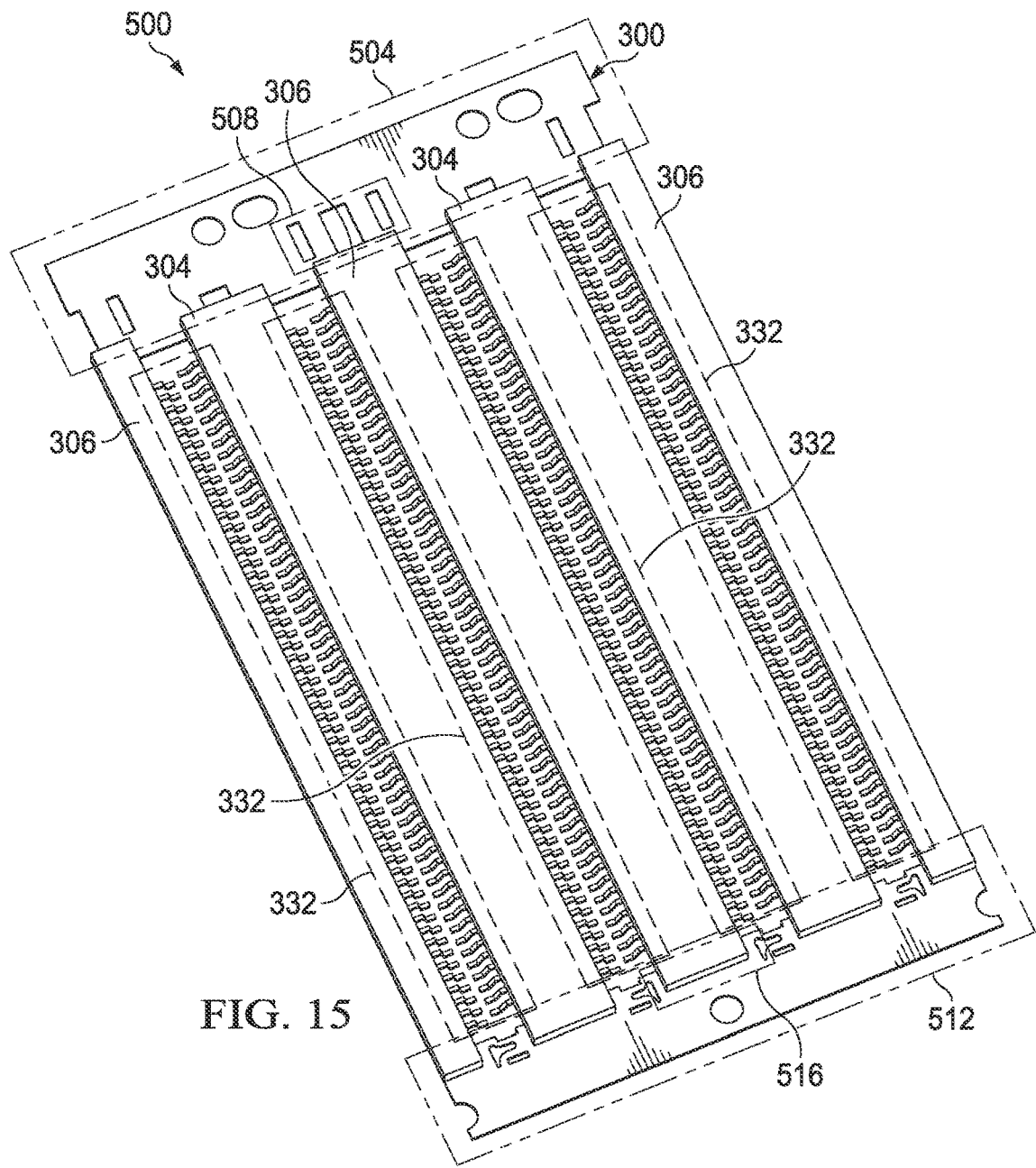
FIG. 15 illustrates an alternative frame of strips of interconnects for singulation.

Furthermore, aligning the pins 332 to provide the aligned array of strips of interconnects 398 in the manner illustrated, obviates the need for features, such as a U-bar or an S-bar, in the first siderail 308 or the second side rail 312 to move the strips of interconnects. For instance, in an alternate example of the method characterized in FIGS. 2-15, in some situations, a frame 500 with a first siderail 504 that includes a U-bar 508 and a second siderail 512 that includes an S-bar 516 is employable in the method. For purposes of simplification of explanation, the same reference numbers are employed in FIGS. 2-15 and 16 to denote the same structure. The U-bar 508 and the S-bar 516 are conventionally employed to align the pins 332 with deformation. However, as noted with respect to FIG. 15, the U-bar 508 and the S-bar 516 are not needed. Instead, the first siderail 504 and the second siderail 512 are removed with the operation at 210 illustrated in FIG. 5. Stated differently, the method for aligning the pins 332 is agnostic to the presence or absence of the U-bar 508 and the S-bar 516.

Figure 16:
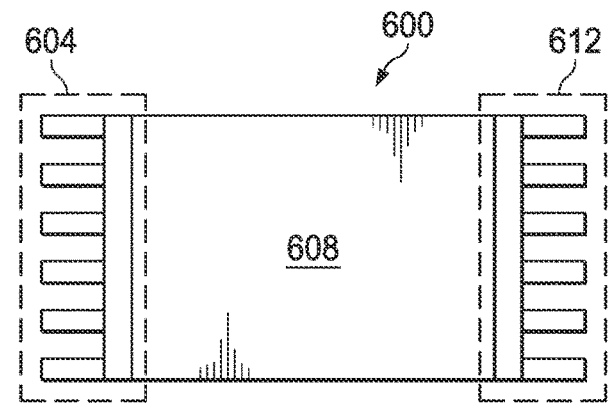
FIG. 16 illustrates an example of a singulated interconnect.

FIG. 16 illustrates an example of an interconnect 600 that has been singulated with the method 100 of FIG. 1 and/or the method described in FIGS. 2-14. The interconnect 600 includes a first row of pins 604 extruding from a body 608 in a first direction and a second row of pins 612 that also extrude from the body 608 in a second direction, opposing the first direction. The interconnect 600 is a DIP interconnect.

Figure 17:
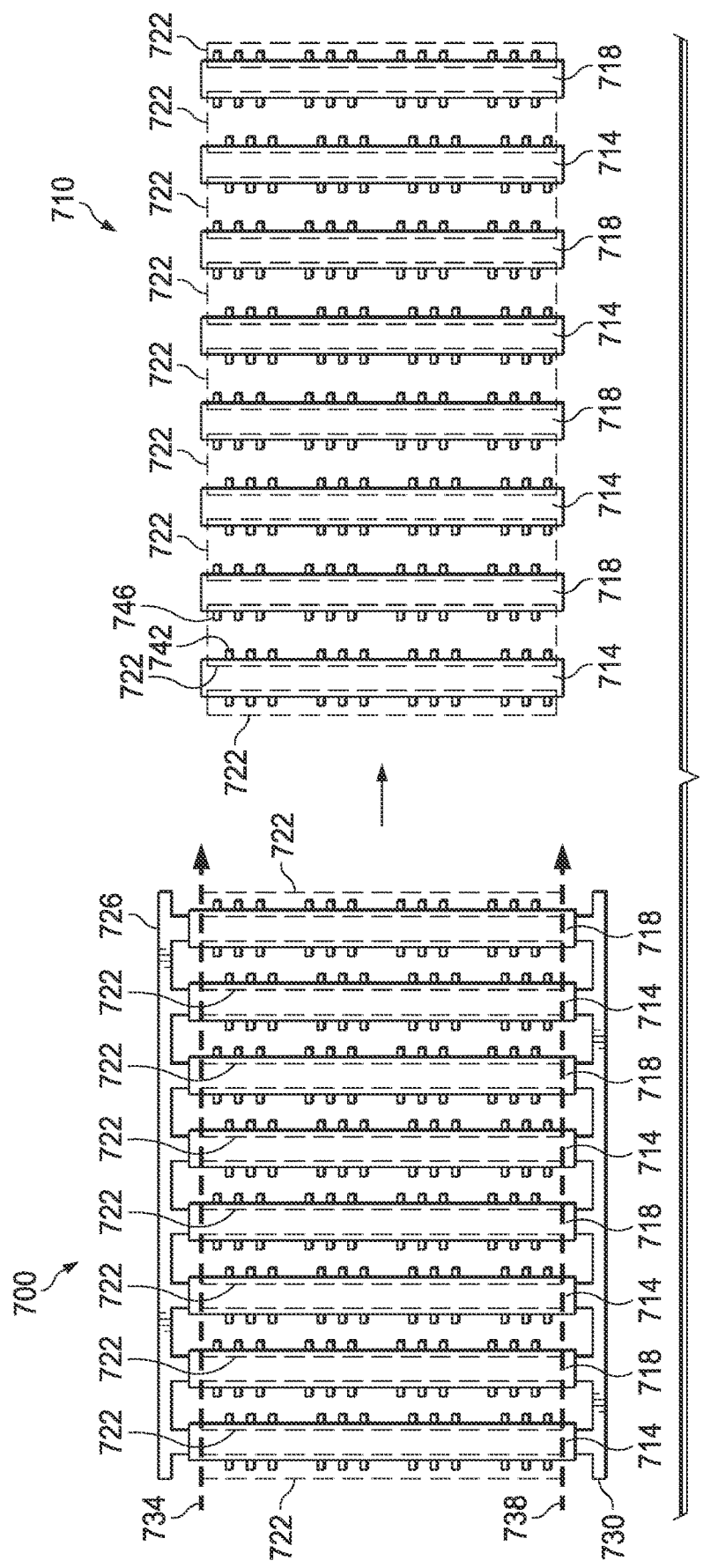
FIG. 17 illustrates first and second stages of another example method for singulating interconnects from strips of interconnects.
Figure 18:
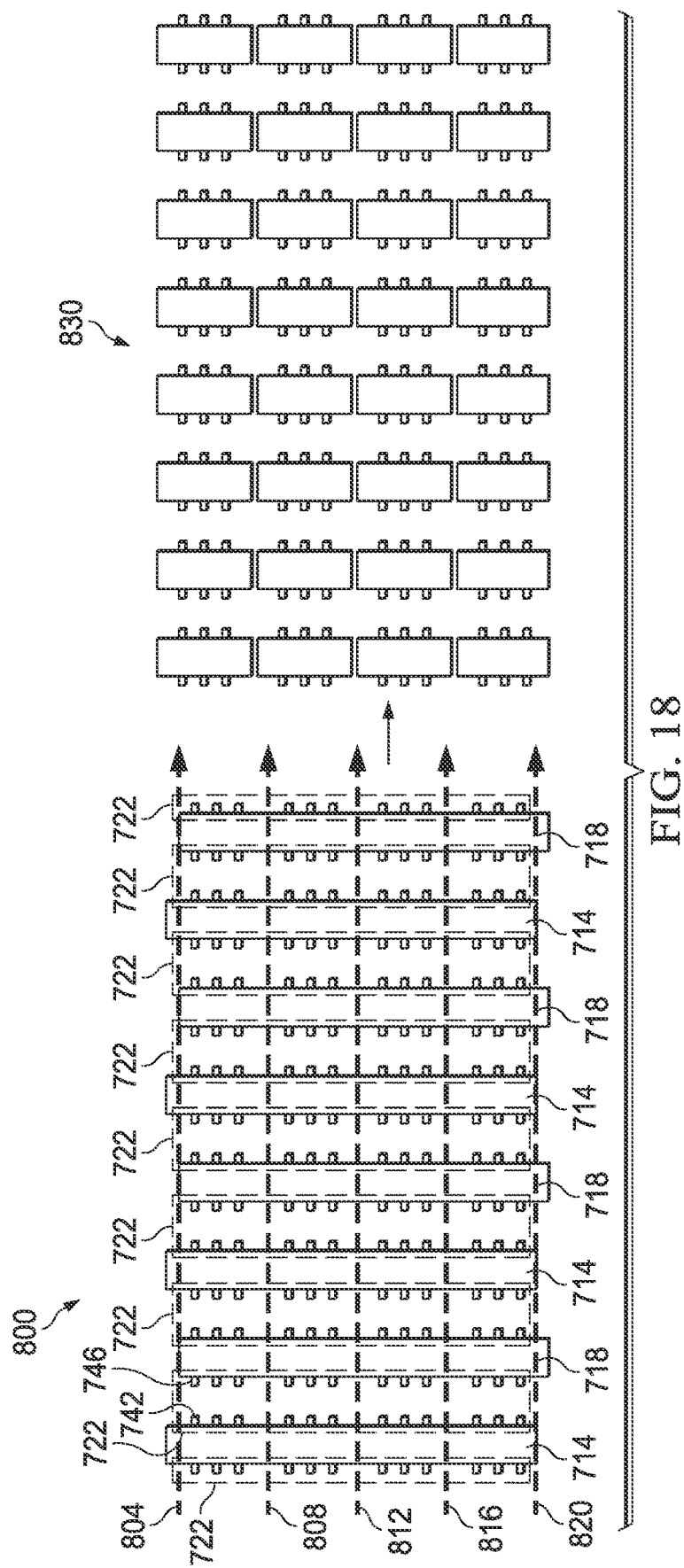
FIG. 18 illustrates third and fourth stages of the other example method for singulating interconnects from strips of interconnects.

FIGS. 17 and 18 illustrate a simplified example of the method for singulating interconnects from a frame of strips of interconnects. FIG. 17 illustrates a first and second stage of the simplified example method. More particularly, FIG. 17 illustrates a frame 700 of strips of interconnects and an array of strips of interconnects 710. The frame 700 of strips of interconnects includes strips of interconnects 714 of a first set and strips of interconnects 718 of a second set. The strips of interconnects 714 of the first set and the strips of interconnects 718 of the second set have pins 722 that have been trimmed and formed. The frame 700 includes a first siderail 726 and a second siderail 730 that hold the strips of interconnects 714 of the first set and the strips of interconnects 718 in place.

The first siderail 726 and the second siderail 730 are removed from the strips of interconnects 714 of the first set and the strips of interconnects 718 of the second set to provide the array of strips of interconnects 710. More specifically, to remove the first siderail 726, first edges of the strips of interconnects 714 of the first set and the strips of interconnects 718 that are proximal to the first siderail 726 are crosscut as indicated by a cutline 734. Similarly, to remove the second siderail 730, second edges (opposing the first edges) of the strips of interconnects 714 of the first set and the strips of interconnects 718 that are proximal to the second siderail 730 are cut, as indicated by a cutline 738.

As illustrated, a pin 742 (e.g., a first pin; only one of which is labeled) nearest a first edge of the strip of interconnects 714 of the first set has a first distance, and a pin 746 (e.g., a first pin, only one of which is labeled) nearest the first edge of the strip of interconnects 718 of the second set has a second distance, different from the first distance. In the example illustrated, the first distance is greater than the second distance, but in other examples, the second distance is greater than the first distance.

FIG. 18 illustrates a third and fourth stages of the simplified example method for singulating interconnects. More specifically, FIG. 18 illustrates an aligned array of strips of interconnects 800 that includes the strips of interconnects 714 of the first set and the strips of interconnects 718 of the second set. The aligned array of strips of interconnects is provided by moving the strips of interconnects 718 of the second set (in FIG. 17) by a measured offset to align the pins 722. The strips of interconnects 718 of the second set are moved by the operations described with respect to FIGS. 8-13. As illustrated, edges of the strips of interconnects 714 of the first set are offset from edges of the strips of interconnects 718 of the second set to align the pins 722.

Accordingly, as indicated, the strips of interconnects 714 of the first set and the strip of interconnects 718 of the second set are cut (e.g., sawn) at cutlines 804, 808, 812, 816 and 820 to provide an array of singulated interconnects 830. Each interconnect in the array of singulated interconnects 830 is employable to implement an instance of the interconnect 600 of FIG. 16.

Modifications are possible in the described embodiments, and other embodiments are possible, within the scope of the claims.

What is claimed is:

1. A method for aligning interconnects comprising:
    trimming and forming a frame of strips of interconnects, wherein the frame of strips of interconnects comprises interdigitated pins;
    removing siderails from the frame of strips of interconnects to provide an array of strips of interconnects;
    aligning a first set of strips of interconnects in the array of strips of interconnects such that pins of the first set of strips of interconnects are aligned with pins of a second set of strips of interconnects in the array of strips of interconnects, wherein a strip of interconnects of the first set of strips of interconnects are adjacent to a strip of interconnects of the second set of strips of interconnects to provide an aligned array of strips of interconnects; and
    singulating the aligned array of strips of interconnects to provide interconnects for dies of integrated circuit (IC) chips.

2. The method of claim 1, wherein cutting the siderails from the strips of interconnects further comprises:
    cutting a first edge and a second edge of the strips of interconnects in the frame of strips of interconnects.

3. The method of claim 1, wherein the siderails attached to the frame of strips of interconnects has seats for the strips of interconnects, and the seats of the strips of interconnects have a same shape.

4. The method of claim 1, wherein the pins of the first set of strips of interconnects in the array of strips of interconnects are interleaved with the pins of the second set of strips of interconnects in the array of strips of interconnects.

5. The method of claim 1, wherein the strips of interconnects in the frames of interconnects comprises die pads for dies of the integrated circuit (IC) chips.

6. The method of claim 1, wherein the interconnects for dies of the IC chips are dual in-line package interconnects.

7. A method for aligning interconnects comprising:
    trimming and forming a frame of strips of interconnects, wherein the frame of strips of interconnects comprises interdigitated pins;
    removing siderails from the frame of strips of interconnects to provide an array of strips of interconnects, including cutting a first edge and a second edge of the strips of interconnects in the frame of strips of interconnects;
    aligning a first set of strips of interconnects in the array of strips of interconnects such that pins of the first set of strips of interconnects are aligned with pins of a second set of strips of interconnects in the array of strips of interconnects, wherein a strip of interconnects of the first set of strips of interconnects are adjacent to a strip of interconnects of the second set of strips of interconnects to provide an aligned array of strips of interconnects,
    moving a given strip of interconnects of the first set of strips of interconnects from an initial position along a first axis;
    measuring an offset of pins on the given strip of interconnects of the first set of strips of interconnects relative to pins of the second set of strips of interconnects;
    moving the first set of strips of interconnects along a second axis by the measured offset, wherein the second axis is perpendicular to the first axis;
    returning the first set of strips of interconnects to the initial position; and
    singulating the aligned array of strips of interconnects to provide interconnects for dies of integrated circuit (IC) chips.

8. The method of claim 7, wherein aligning a first set of strips of interconnects further comprises:
    ascending the given strip of interconnects along a third axis from a sawing chuck table to the initial position, wherein the third axis is perpendicular to the first axis and the second axis.

9. The method of claim 8, wherein aligning a first set of strips of interconnects further comprises:
    descending the given strip of interconnects along the third axis from the initial position to the sawing chuck table in response to the returning.

10. The method of claim 7, wherein the measuring comprises:
    capturing an image of the given strip of interconnects;
    comparing the image of the given strip of interconnects to an image of another strip of interconnects; and
    determining a distance between pins on the given strip of interconnects with pins of the other strip of interconnects, wherein the distance is the offset of the pins of the given strip of interconnects.

11. The method of claim 10, wherein the pins of the first set of strips of interconnects are aligned within 25 micrometers of the pins of the second set of strips of interconnects in the aligned array of strips of interconnects.

12. A method for aligning interconnects comprising:
    trimming and forming a frame of strips of interconnects, wherein the frame of strips of interconnects comprises interdigitated pins;
    removing siderails from the frame of strips of interconnects to provide an array of strips of interconnects;
    aligning a first set of strips of interconnects in the array of strips of interconnects such that pins of the first set of strips of interconnects are aligned with pins of a second set of strips of interconnects in the array of strips of interconnects, wherein a strip of interconnects of the first set of strips of interconnects are adjacent to a strip of interconnects of the second set of strips of interconnects to provide an aligned array of strips of interconnects;
    flipping the first set of strips of interconnects of the array of strips of interconnects and the second set of strips of interconnects of the array of strips of interconnects;
    resting the flipped first set of strips of interconnects of the array of strips of interconnects and the flipped second set of strips of interconnects of the array of strips of interconnects on a sawing chuck table; and
    singulating the aligned array of strips of interconnects to provide interconnects for dies of integrated circuit (IC) chips.

13. The method of claim 12, wherein the sawing chuck table comprises first pillars and second pillars for the array of strips of interconnects, wherein each first pillar of the first pillars is spaced apart from a corresponding second pillar of the second pillars.

14. A method for aligning interconnects comprising:
trimming and forming a frame of strips of interconnects, wherein the frame of strips of interconnects comprises interdigitated pins;
removing siderails from the frame of strips of interconnects to provide an array of strips of interconnects;
after the trimming and forming the frame of strips of interconnects and after removing the siderails, aligning a first set of strips of interconnects in the array of strips of interconnects such that pins of the first set of strips of interconnects are aligned with pins of a second set of strips of interconnects in the array of strips of interconnects, wherein a strip of interconnects of the first set of strips of interconnects are adjacent to a strip of interconnects of the second set of strips of interconnects to provide an aligned array of strips of interconnects; and
singulating the aligned array of strips of interconnects to provide interconnects for dies of integrated circuit (IC) chips.

15. The method of claim 1, wherein cutting the siderails from the strips of interconnects further comprises:
cutting a first edge and a second edge of the strips of interconnects in the frame of strips of interconnects.

16. The method of claim 15, wherein singulating the array of aligned strips of interconnects further comprises:
making parallel crosscuts in the aligned array of strips of interconnects.

17. The method of claim 15, wherein aligning a first set of strips of interconnects in the array of strips of interconnects further comprises:
moving a given strip of interconnects of the first set of strips of interconnects from an initial position along a first axis;
measuring an offset of pins on the given strip of interconnects of the first set of strips of interconnects relative to pins of the second set of strips of interconnects;
moving the first set of strips of interconnects along a second axis by the measured offset, wherein the second axis is perpendicular to the first axis; and
returning the first set of strips of interconnects to the initial position.

18. The method of claim 17, wherein aligning a first set of strips of interconnects further comprises:
ascending the given strip of interconnects along a third axis from a sawing chuck table to the initial position, wherein the third axis is perpendicular to the first axis and the second axis.

19. A method for aligning interconnects comprising:
trimming and forming a frame of strips of interconnects, wherein the frame of strips of interconnects comprises interdigitated pins;
removing siderails from the frame of strips of interconnects to provide an array of strips of interconnects, including cutting a first edge and a second edge of the strips of interconnects in the frame of strips of interconnects;
aligning a first set of strips of interconnects in the array of strips of interconnects such that pins of the first set of strips of interconnects are aligned with pins of a second set of strips of interconnects in the array of strips of interconnects, wherein a strip of interconnects of the first set of strips of interconnects are adjacent to a strip of interconnects of the second set of strips of interconnects to provide an aligned array of strips of interconnects; and
making parallel crosscuts in the aligned array of strips of interconnects to singulate the aligned array of strips of interconnects to provide interconnects for dies of integrated circuit (IC) chips.

20. A method for aligning interconnects comprising:
trimming and forming a frame of strips of interconnects, wherein the frame of strips of interconnects comprises interdigitated pins, wherein the strip of interconnects of the first set of strips of interconnects have a first distance between an edge of a respective strip of interconnects of the first strip of interconnects and a pin nearest to the edge of the respective strip of interconnects of the first strip of interconnects, and the strips of interconnects of the second set of strips of interconnects have a second distance between an edge of a respective strip of interconnects of the second set of strips of interconnects and a pin nearest to the edge of the respective strip of interconnects of the second set of strips of interconnects, the first distance being different than the second distance, wherein the pins of the first set of strips of interconnects in the array of strips of interconnects are interleaved with the pins of the second set of strips of interconnects in the array of strips of interconnects;
removing siderails from the frame of strips of interconnects to provide an array of strips of interconnects;
aligning a first set of strips of interconnects in the array of strips of interconnects such that pins of the first set of strips of interconnects are aligned with pins of a second set of strips of interconnects in the array of strips of interconnects, wherein a strip of interconnects of the first set of strips of interconnects are adjacent to a strip of interconnects of the second set of strips of interconnects to provide an aligned array of strips of interconnects; and
singulating the aligned array of strips of interconnects to provide interconnects for dies of integrated circuit (IC) chips.

* * * * *